United States Patent
Wirth et al.

(10) Patent No.: US 10,574,920 B2
(45) Date of Patent: Feb. 25, 2020

(54) POOLING OF TWO COLUMNS OF PIXELS OF AN IMAGE DETECTOR

(71) Applicant: TRIXELL, Moirans (FR)

(72) Inventors: Thibaut Wirth, Moirans (FR); Bruno Bosset, Moirans (FR); Simon Marecaux, Moirans (FR); Claude Venin, Moirans (FR); Pierre Rohr, Moirans (FR)

(73) Assignee: TRIXELL, Moirans (FR)

( * ) Notice: Subject to any disclaimer, the term of this patent is extended or adjusted under 35 U.S.C. 154(b) by 0 days.

(21) Appl. No.: 15/033,034

(22) PCT Filed: Nov. 5, 2014

(86) PCT No.: PCT/EP2014/073764
§ 371 (c)(1),
(2) Date: Apr. 28, 2016

(87) PCT Pub. No.: WO2015/071140
PCT Pub. Date: May 21, 2015

(65) Prior Publication Data
US 2016/0286146 A1 Sep. 29, 2016

(30) Foreign Application Priority Data
Nov. 15, 2013 (FR) .................. 13 61186

(51) Int. Cl.
*H04N 5/378* (2011.01)
*H01L 27/146* (2006.01)
*H04N 5/374* (2011.01)

(52) U.S. Cl.
CPC ....... *H04N 5/378* (2013.01); *H01L 27/14634* (2013.01); *H01L 27/14636* (2013.01); *H01L 27/14643* (2013.01); *H04N 5/374* (2013.01)

(58) Field of Classification Search
USPC ............................ 257/59, 72, 222, 225, 440
See application file for complete search history.

(56) References Cited

U.S. PATENT DOCUMENTS

| | | | | |
|---|---|---|---|---|
| 5,900,767 A | * | 5/1999 | Bird | H04N 5/359 327/407 |
| 2002/0085670 A1 | * | 7/2002 | Vafi | A61B 6/032 378/98.8 |
| 2005/0104089 A1 | * | 5/2005 | Engelmann | G01J 5/02 257/204 |

(Continued)

FOREIGN PATENT DOCUMENTS

| | | |
|---|---|---|
| EP | 2 549 299 A2 | 1/2013 |
| JP | 2011-78049 A | 4/2011 |

(Continued)

*Primary Examiner* — Quan Pham
(74) *Attorney, Agent, or Firm* — Baker & Hostetler LLP (57) ABSTRACT

An image detector comprises a sensor produced on a first monolithic substrate comprising a set of pixels organized in a matrix on rows and columns and configured to generate signals as a function of a radiation striking the detector, column conductors, each linking the pixels of a same column and intended to convey the signals generated by the pixels, at least one bump contact situated at the periphery of the first substrate and outside of the matrix of pixels and linked to the column conductors. At least two column conductors are connected together on the first substrate outside of the matrix of pixels and the column conductors connected together converge toward the at least one bump contact.

7 Claims, 10 Drawing Sheets

(56) References Cited

U.S. PATENT DOCUMENTS

| | | | |
|---|---|---|---|
| 2006/0023109 A1* | 2/2006 | Mabuchi | H01L 24/17 348/340 |
| 2008/0042046 A1* | 2/2008 | Mabuchi | H01L 27/14634 250/208.1 |
| 2009/0146196 A1* | 6/2009 | Cieslinski | H04N 5/3658 257/291 |
| 2010/0079611 A1* | 4/2010 | Suzuki | H04N 5/374 348/222.1 |
| 2010/0091150 A1* | 4/2010 | Ogasawara | H04N 5/2257 348/294 |
| 2010/0208114 A1* | 8/2010 | Kwon | H03M 3/474 348/308 |
| 2011/0080507 A1 | 4/2011 | Iwasa | |
| 2011/0254988 A1* | 10/2011 | Itakura | H01L 27/14634 348/308 |
| 2012/0119065 A1 | 5/2012 | Cieslinski | |
| 2012/0120293 A1 | 5/2012 | Mabuchi | |
| 2012/0286138 A1 | 11/2012 | Yamazaki | |
| 2013/0092820 A1* | 4/2013 | Takemoto | H04N 5/369 250/208.1 |
| 2013/0182154 A1* | 7/2013 | Kimura | H04N 5/2353 348/272 |
| 2014/0263959 A1* | 9/2014 | Hsu | H01L 31/18 250/208.1 |
| 2015/0326811 A1* | 11/2015 | Nishida | H04N 5/378 348/308 |

FOREIGN PATENT DOCUMENTS

| | | |
|---|---|---|
| JP | 2012-104684 A | 5/2012 |
| WO | 95/17767 A1 | 6/1995 |
| WO | WO 95/17767 * | 6/1995 |

* cited by examiner

POOLING OF TWO COLUMNS OF PIXELS OF AN IMAGE DETECTOR

CROSS-REFERENCE TO RELATED APPLICATIONS

This application is a National Stage of International patent application PCT/EP2014/073764, filed on Nov. 5, 2014, which claims priority to foreign French patent application No. FR 1361186, filed on Nov. 15, 2013, the disclosures of which are incorporated by reference in their entirety.

FIELD OF THE INVENTION

The invention relates to an imaging device. The invention can be implemented for image capture in a detector. This type of device comprises a large number of sensitive points called pixels generally organized in a matrix or in a linear array.

BACKGROUND

The invention is of use in producing visible images but is not limited to that field. In the context of the invention, the term imaging should be understood in a broad sense. It is for example possible to produce mappings of pressure or of temperature or even two-dimensional representations of chemical or electrical potentials. These mappings or representations form images of physical quantities.

In a detector, a pixel represents the basic sensitive element of the detector. Each pixel converts a physical phenomenon to which it is subjected to an electrical signal. The electrical signals from the different pixels are collected in a matrix reading phase then digitized so as to be able to be processed and stored to form an image. The pixels are formed by a zone sensitive to the physical phenomenon and delivering a current of electrical charges. The physical phenomenon can be an electromagnetic radiation and, subsequently, the invention will be explained by means of this type of radiation and the charge current is a function of the flow of photons received by the sensitive zone. Generalization to any imaging device will be easy.

The photosensitive zone generally comprises a photosensitive element, or photo detector, which can for example be a photodiode, two diodes head-to-tail, a photo resistor or a photo transistor. There are photosensitive matrices of large dimensions which can have several millions of pixels. Each pixel consists of a photosensitive element and an electronic circuit consisting, for example, of switches, capacitances, resistors, downstream of which there is an actuator. The assembly consisting of the photosensitive element and the electronic circuit makes it possible to generate electrical charges and collect them. The electronic circuit generally makes it possible to reset the charge collected in each pixel after a charge transfer. The role of the actuator is to transfer or copy the charges collected by the circuit into a column conductor. This transfer is performed when the actuator receives the instruction to do so. The output of the actuator corresponds to the output of the pixel.

In this type of detector, a pixel operates according to two phases: an image capture phase, during which the electronic circuit of the pixel accumulates the electrical charges generated by the photosensitive element, and a reading phase, during which the collected charges are transferred or copied into the column conductor by virtue of the actuator.

During the image capture phase, the actuator is passive and the collected electrical charges cause the potential to change at a point of connection between the photosensitive element and the actuator. This point of connection is called charge collection node of the pixel or, more simply, node of the pixel. During the reading phase, the actuator is active in order to release the charges accumulated at the photosensitive point in order to convey them or copy them, even copy the potential of the node of the pixel to a reading circuit of the detector arranged downstream of the actuator.

A passive actuator should be understood to be an actuator that is not in electrical contact with the reading circuit. Thus, when the actuator is passive, the charges collected in the pixel are neither transferred nor copied into the reading circuit.

An actuator can be a switch controlled by a clock signal. It is generally a transistor. It can also be a follower circuit or any other device making it possible to carry or transfer the charge collected in the pixel to the reading circuit, for example a device known by the acronym CTIA (Capacitive TransImpedance Amplifier).

This type of pixel can be used for the imaging of ionizing radiations, and notably X or y radiation detectors, in the medical field or that of non-destructive inspection in the industrial field, for the detection of radiological images. In some detectors, the photosensitive elements make it possible to detect a visible or near-visible electromagnetic radiation. These elements have little or no sensitivity to the incident radiation on the detector that is to be detected. A radiation converter, called scintillator, is then used which converts the incident radiation, for example an X radiation, into a radiation in a band of wavelengths to which the photosensitive elements present in the pixels are sensitive.

According to another type of detector, increasingly widely used, the detector material is a semiconductor, sensitive to the radiation, for example X or y, to be detected. An interaction of a radiation in the detector generates charge carriers. The charges generated are collected by an interaction at a terminal, called node of the pixel.

During the image capture phase, the electromagnetic radiation, in the form of photons received by each photosensitive element, is converted into electrical charges (electron/hole pairs) and each pixel generally comprises a capacitance making it possible to accumulate these charges to make the voltage of the node of the pixel change. This capacitance can be intrinsic to the photosensitive element, in which case it is called stray capacitance, or added in the form of a capacitor connected in parallel to the photosensitive element.

Generally, the pixels are read individually. The matrix can for example comprise a column conductor associated with each column of pixels of the matrix. In this case, a read instruction is sent to all the actuators of a same row of the matrix and each of the pixels of that row is read by transferring its electrical information, charge, voltage, current, frequency, etc., to the column conductor with which it is associated.

A number of pixels may be required to be grouped together so that they can be read collectively. This grouping can be useful in order to increase the reading speed of the matrix or even to improve the signal-to-noise ratio of each element read. The grouped pixels can have means for performing the operations of summing or averaging the electrical information items from the grouped pixels. These means can be analog or digital.

Subsequently, the case will be described in which the electrical information item is available in analog form in the pixels, in the form of quantities of charges stored on capacitors of the same value. It is of course understood that the invention can be implemented for any form of electrical information item generated in each of the pixels.

An image detector generally comprises an image sensor. The image sensor comprises row conductors, each linking the pixels of a same row, and column conductors, each linking the pixels of a same column. The column conductors are connected to a reading circuit, also called column reading block.

The connection between the column reading block and a column conductor is made at a bump contact. There are therefore, in the traditional configuration of an image detector, as many bump contacts as there are column conductors and therefore as there are columns of pixels. A spacing between two column conductors is defined. The spacing between two column conductors corresponds to the spacing between two bump contacts. For some applications, there may be a requirement to reduce the spacing between two column conductors while maintaining a greater spacing between two bump contacts. Such is the case notably in the field of medical imaging by X rays and more particularly for an application to mammography in which high quality images are required. The pixel can occupy a squared surface area of the order of 50 micrometers (μm) side, that is to say smaller than the usual sizes of pixels used in standard X radiology. The spacing between the bump contacts is then reduced. The connection of the bump contacts with the column reading block is made by means of connector modules. Now, the connector modules are not necessarily suited to small spacings between two bump contacts.

SUMMARY OF THE INVENTION

The invention aims to reduce the spacing between two column conductors while maintaining a greater spacing between two bump contacts by proposing a pooling of two columns of pixels of an image detector.

To this end, the subject of the invention is an image detector comprising:
  a sensor produced on a first monolithic substrate comprising:
    a set of pixels organized in a matrix in rows and columns and configured so as to generate signals as a function of a radiation striking the detector,
    column conductors, each linking the pixels of a same column and intended to convey the signals generated by the pixels,
    at least one bump contact situated at the periphery of the first substrate and outside of the matrix of pixels and linked to the column conductors,
  characterized in that at least two column conductors are connected together on the first substrate outside of the matrix of pixels and the column conductors connected together converge toward a bump contact.

BRIEF DESCRIPTION OF THE DRAWINGS

The invention will be better understood and other advantages will become apparent on reading the detailed description of an embodiment given by way of example, the description being illustrated by the attached drawing in which.

In the interests of clarity, the same elements will bear the same references in the different figures.

DETAILED DESCRIPTION

Generally, the invention relates to an image detector comprising a sensor comprising a set of pixels organized in a matrix in lines and columns, row addressing blocks, column reading blocks, row conductors linking the rows of pixels to a row addressing block and column conductors linking columns of pixels to a column reading block. It should be noted that, in the context of the present patent application, the concepts of column and of row have only a relative meaning, a row of pixels and a column of pixels being nothing more than rows of pixels arranged, for example, at right angles to one another. A row conductor, respectively column conductor, is defined as being oriented parallel to a row of pixels, respectively a column of pixels.

Figure 1A:
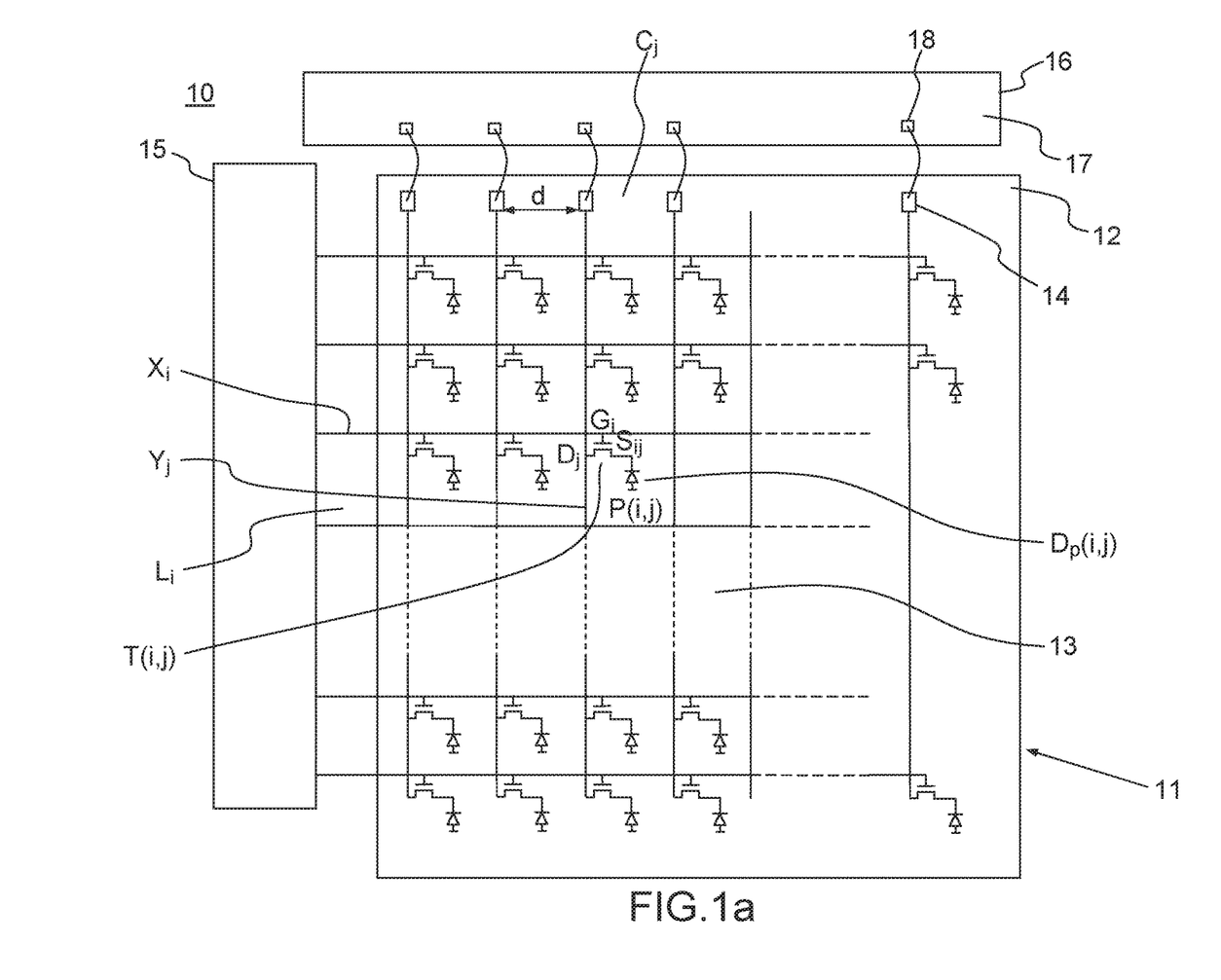
FIGS. 1a and 1b represent a traditional image detector.
Figure 1B:
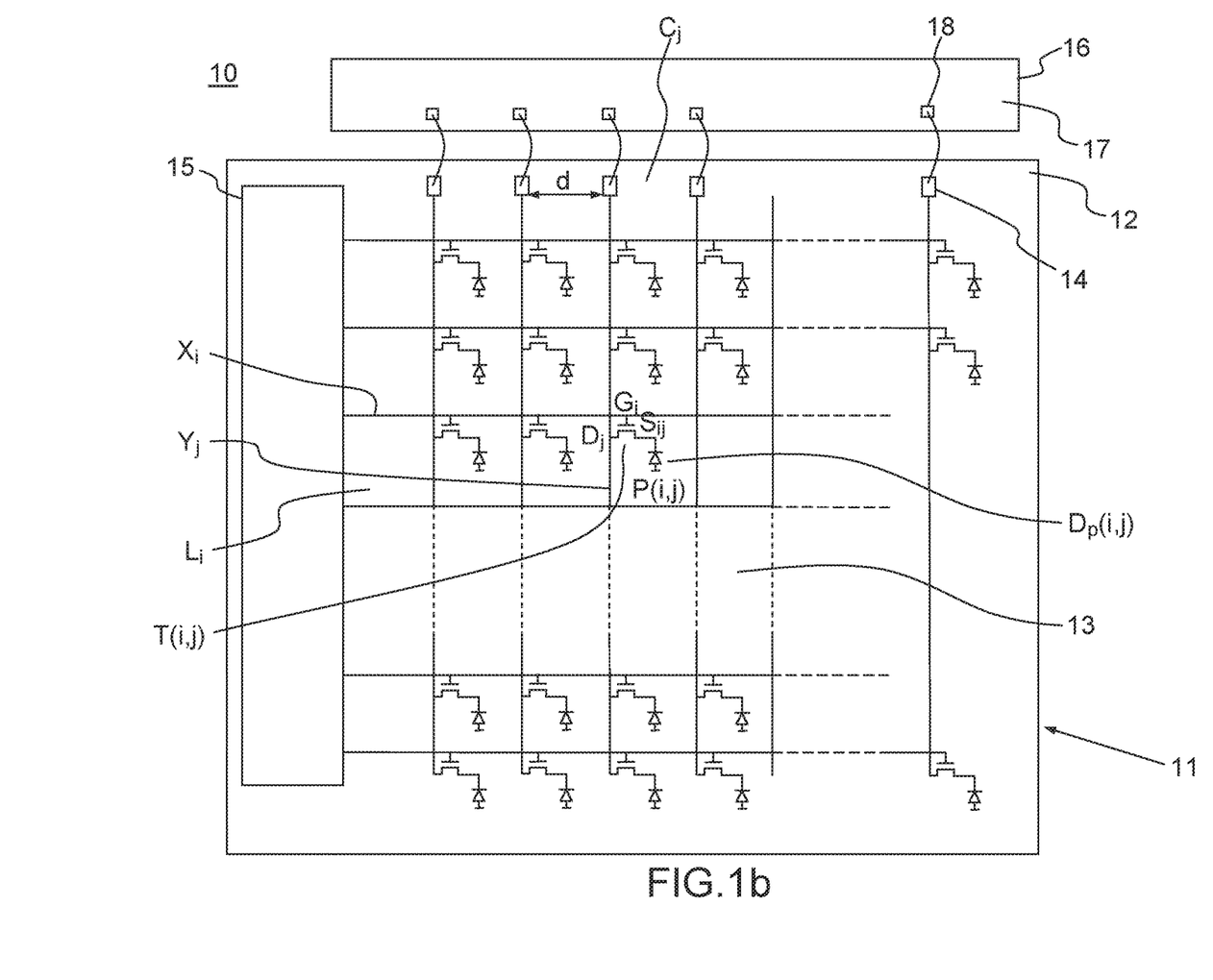

FIG. 1a represents a traditional image detector 10. The image detector 10 comprises a sensor 11 produced on a first monolithic substrate 12. The first monolithic substrate 12 comprises a set of pixels P(i,j) organized in a matrix 13 in rows Li and columns Cj. The matrix 13 can comprise any number of rows and of columns thus forming pixels P(i,j). The matrix 13 forms a geographic zone on the first substrate 12. The pixels are denoted in the generic form P(i,j), in which i and j are natural integers respectively denoting the rank of the row and the rank of the column in the matrix 13. The set of pixels P(i,j) is configured so as to generate signals as a function of a radiation striking the detector 10. The sensor 11 comprises column conductors Yj, each linking the pixels of a same column Cj. The column conductors Yj are intended to convey the signals generated by the pixels P(i,j). Similarly, the sensor 11 comprises row conductors Xi, each linking the pixels of a same row Li. The matrix 13 of pixels P(i,j) comprises columns Cj of even ranks and of odd ranks. Similarly, the matrix 13 of pixels P(i,j) comprises rows Li of even ranks and of odd ranks. The sensor 11 comprises bump contacts 14 situated at the periphery of the first substrate 12 and outside of the matrix 13 of pixels P(i,j). The bump contacts 14 are linked to the column conductors Yj. In the traditional image detector 10, there are as many bump contacts as there are column conductors Yj. The spacing between two neighboring bump contacts is denoted d. The image detector 10 comprises a row addressing block 15 situated in proximity to the first substrate 12 and linked to the row conductors Xi. Any set comprising at least one row addressing block is called row addressing block 15. The block 15 can be incorporated in the first substrate 12, as represented in FIG. 1b, or incorporated in a distinct substrate, as represented in FIG. 1a. The row addressing block 15 makes it possible to individually address each row of pixels Li. The image detector 10 comprises a column reading block 16 produced on a second substrate 17 different from the first substrate 12. The column reading block 16 comprises connection points 18 linking the column reading block 16 to the bump contacts 14. The column reading block 16 makes it possible to read the signals generated by the pixels of the row selected by the row addressing block.

A pixel P(i,j) comprises a photodiode Dp(i,j) associated with an electronic switch T(i,j). The photodiodes Dp(i,j) can naturally be replaced by any photosensitive element suitable for generating an electrical signal when it is subjected to a photon radiation. The pixel structure represented in FIG. 1a is deliberately simplified and more complex structures can be implemented in the context of the invention. It is possible for example to produce a pixel from a configuration with three transistors. A first transistor makes it possible to reset a potential of the cathode of the photodiode, a second transistor operates as follower and a third transistor fulfils the role of electronic switch. It makes it possible to select the row Li of pixels P(i,j) for which the signal is to be read. Alternatively, the electronic switch function can be fulfilled by a switching diode.

The switch T(i,j) formed by a transistor is linked by its gate Gi to the row conductor Xi of the row i, by its drain Dj to the column conductor Yj and by its source Sij to the cathode of the photodiode Dp(i,j). The anodes of all the photodiodes Dp(i,j) are linked to a common potential, for example the ground. The row addressing block 15 comprises elements that make it possible to generate the signals to be injected on the row conductors Xi to drive the opening and the closing of the transistors T(i,j). The column reading block 16 can comprise elements making it possible to process the signals received on the column conductors Yj. In particular, it can be an amplifier and/or an analog-digital converter.

The image sensor 11 operates as follows. During an image capture phase, the exposure of the photodiodes Dp(i,j) to a radiation generates electrical charges at the source Sij. The quantity of charges at each source Sij is a function of the intensity of the radiation received by the pixel P(i,j) concerned. The image capture phase is followed by a reading phase performed row-by-row. The signals injected on the different row conductors Xi switch successively to the active state, such that the potential of each column conductor Yj is successively representative of the quantity of electrical charges accumulated in the different pixels P(i,j) of the column j.

Figure 2A:
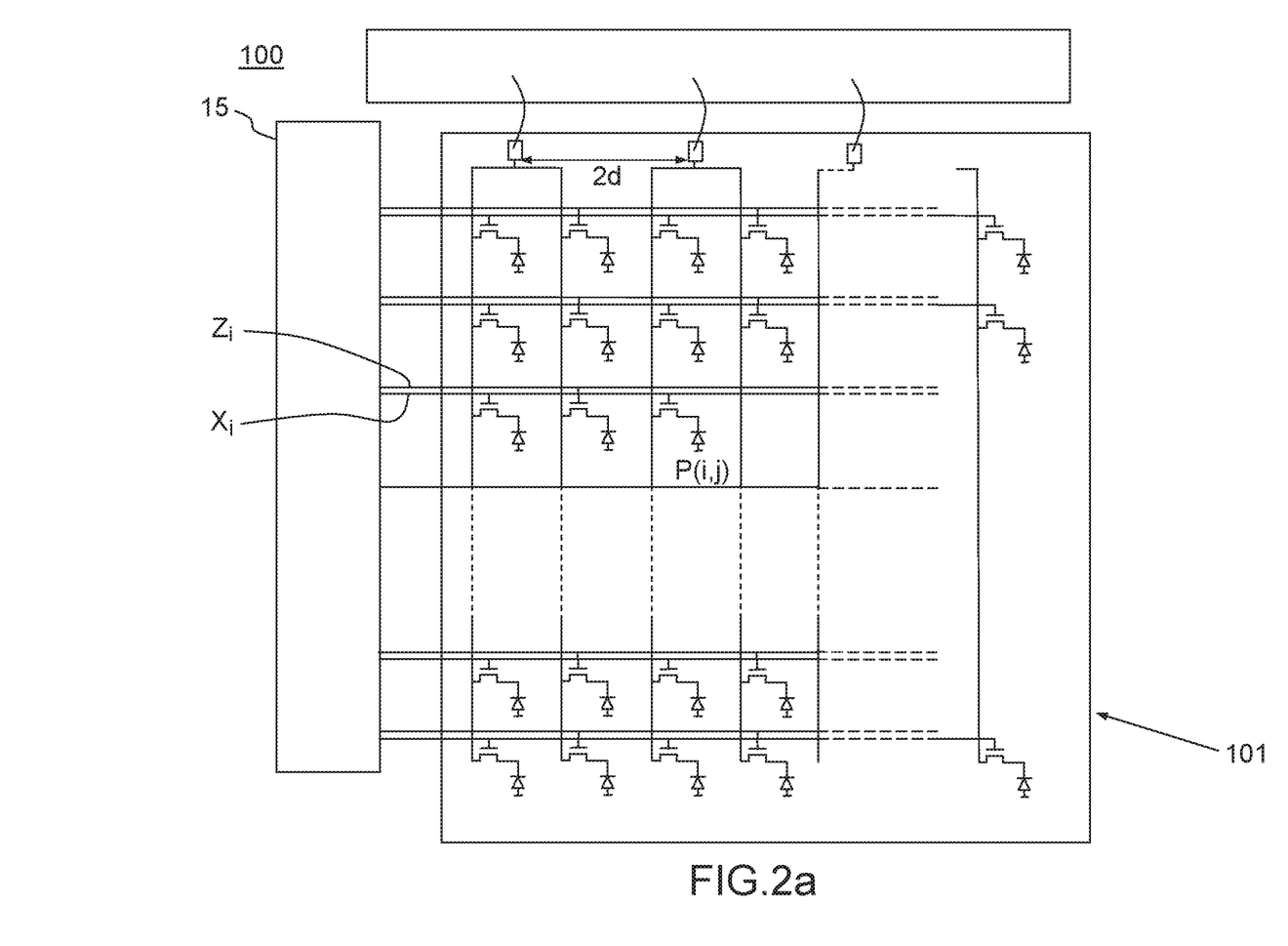
FIGS. 2a and 2b represent an image detector configuration according to the invention.

FIG. 2a represents a configuration of an image detector 100 according to the invention. All the elements are identical to the image detector 10 represented in FIGS. 1a and 1b except for the connection of the column conductors Yj to the bump contacts 14. In effect, according to the invention, at least two column conductors Yj are connected together on the first substrate 12 outside of the matrix 13 of pixels P(i,j) and the column conductors Yj connected together converge toward a same bump contact 14. Here, a configuration is dealt with in which two column conductors are linked together. It is of course possible to connect more than two column conductors together and to make them converge toward a single bump contact. The spacing between two neighboring bump contacts in the configuration of the image detector 100 according to the invention is then twice the spacing between two neighboring bump contacts in the traditional configuration of the image detector 10. In other words, the spacing between two neighboring bump contacts in the configuration of the image detector 100 according to the invention is equal to 2d.

Furthermore, the configuration of the image detector represented in FIG. 2a requires a double row conductor per row Li of pixels P(i,j). In effect since two columns j and j+1 are pooled at a bump contact 14, the column reading block 16 processes the signals received at the bump contact 14. In other words, the column reading block 16 processes the quantity of electrical charges accumulated in the different pixels P(i,j) of the two columns j and j+1. However, the aim is to be able to read the column j separately from the column j+1. Thus, in addition to the row conductor Xi, another row conductor is defined Zi. Xi is a row conductor corresponding to the columns of odd ranks and Zi is a row conductor corresponding to columns of even ranks. To read the quantity of electrical charges accumulated in the different pixels P(i,j) of the column j, j being odd, the signal injected on the row conductor Xi switches to the active state, such that the potential of each column conductor Yj is representative of the quantity of electrical charges accumulated in the different pixels P(i,j) of the column j. Similarly, for the even column (j+1), the signal is injected on the row conductor Zi. The column reading block 16 can process the quantity of electrical charges accumulated in the different pixels P(i,j) either of the column j, or of the column j+1.

The pooling of two column conductors two-by-two on the first substrate 12 outside of the matrix 13 of pixels P(i,j) and converging toward a bump contact 14 provides an additional advantage. Since the connection is made outside of the matrix 13, if a column Cj of pixels P(i,j) is defective, the neighboring column pooled with the column Cj can still be read correctly.

However, the capacitive charge formed by two column conductors connected together at a bump contact is significantly increased since it is no longer the capacitive charge of a single column conductor but the capacitive charge of two column conductors that can also be considered as a single column conductor but twice as long and therefore with a greater capacity. Now, the greater the capacity of a column conductor, the more noise there is in the image detector, therefore reducing the quality of the image.

Figure 2B:
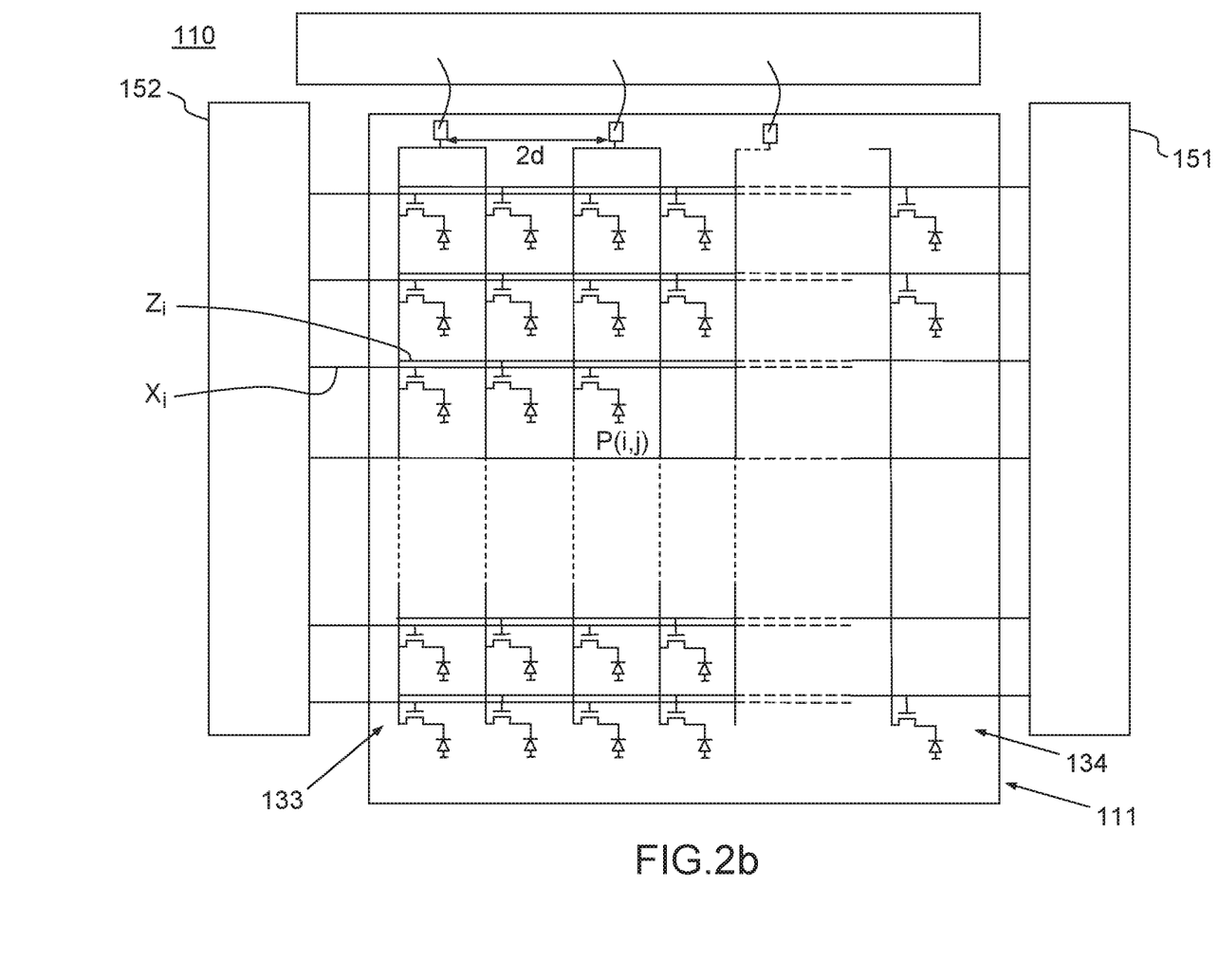

FIG. 2b represents an image detector 110 comprising a sensor 111 corresponding to the same configuration of the image detector 100 according to the invention. A row addressing block 151 is situated on one side 134 of the matrix 13 and a row addressing block 152 is situated on another side 133 of the matrix 13. It should be noted that, in the case of a matrix formed by four sides, the row addressing block 151 is situated on one side 134 of the matrix 13 and the row addressing block 152 is situated on another side 133 of the matrix, opposite that where the row addressing block 151 is situated. It is also possible to have a matrix that has more than four sides, for example six sides for a hexagonal matrix or eight sides for an octagonal matrix. In this case, the row addressing block 152 is situated on another side of the matrix, not necessarily opposite that where the row addressing block 151 is situated. The row conductors Xi of rows of even ranks are linked to the row addressing block 152 on the side 133 of the matrix 13 and the row conductors Zi of rows of odd ranks are linked to the second row addressing block 151 on the other side 134 of the matrix 13.

Generally, the image detector is produced in thin layers on a glass substrate. More specifically, it can be produced in thin layers of amorphous silicon, denoted a-Si. In the literature, the term TFT is also used for a-Si thin film transistor. The image detector can also be produced in thin layers of poly-silicon, often called, in the literature, LTPS, for low temperature polysilicon. The image detector can also be produced with metal oxides. Examples that can be cited are the oxides of zinc IGZO, for indium gallium zinc oxide or IZO, for indium zinc oxide. Finally, the image detector can be produced with organic materials, also called OTFT for organic TFT.

These days, the substrates supporting thin film technologies are traditionally made of glass. An image detector can also be produced on a polymer substrate.

It is also possible to produce an image detector in monocrystalline silicon of CMOS (complementary metal oxide semiconductor) or BiCMOS (bipolar CMOS) type. In this case, the substrate consists of the same material, that is to say that the substrate is made of silicon.

Figure 3:
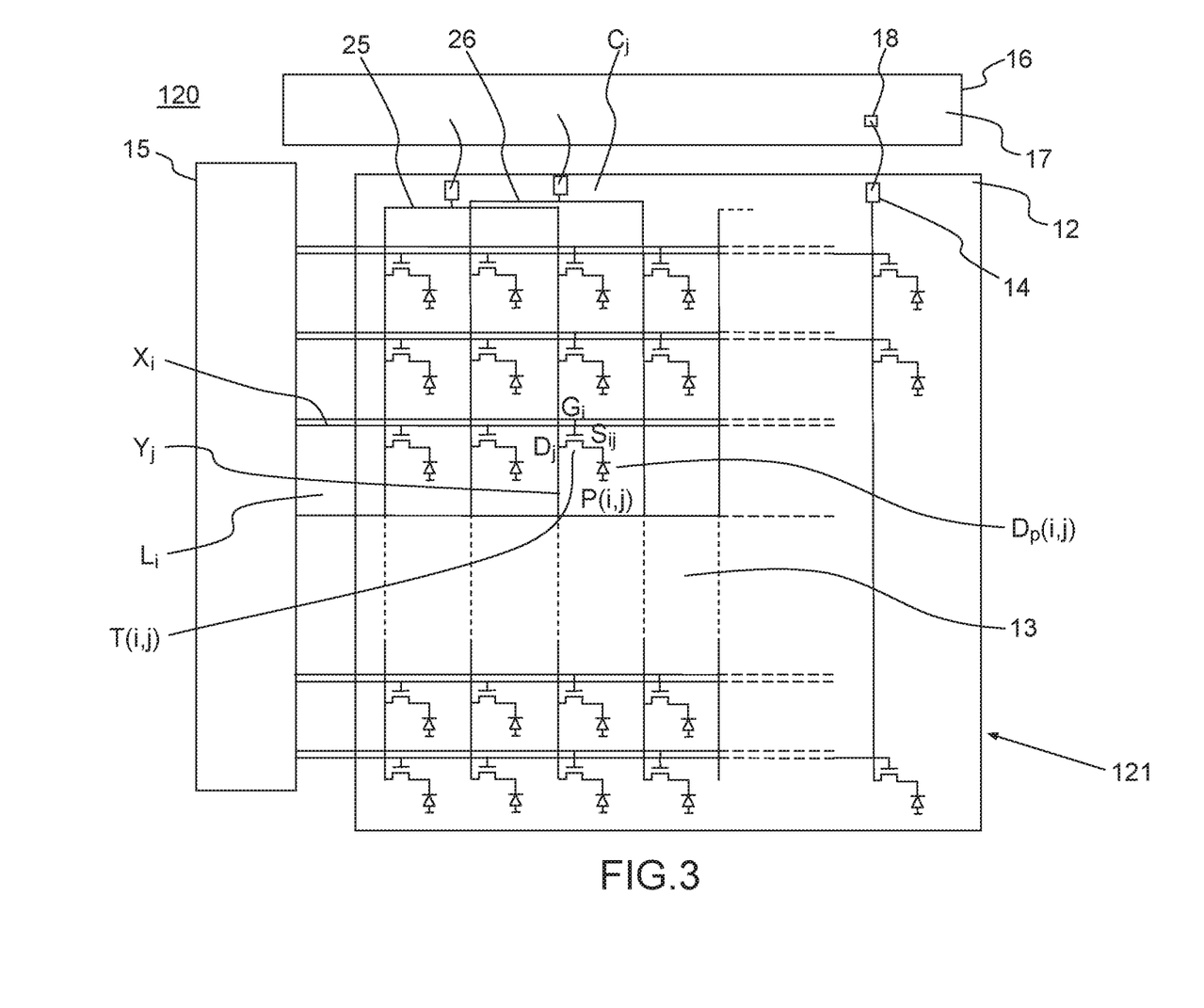
FIG. 3 represents a second image detector configuration according to the invention.

FIG. 3 represents another configuration of an image detector 120 with a sensor 121 according to the invention. All the elements are identical to the image detector 100 represented in FIG. 2a, except for the connection of the column conductors Yj. In the configuration of FIG. 3, the connection between two column conductors Yj is made between column conductors Yj of columns Cj not immediately neighboring one another. In other words, a first group 25 of connected conductors and a second group 26 of connected conductors are defined. Two column conductors Yj belong to the first group 25 of connected conductors and two other column conductors Yj belong to the second group 26 of connected conductors. The first group 25 and the second group 26 are not connected together and the first group 25 and the second group 26 are interleaved. The advantage of this configuration lies in the fact that if a column is defective and no repair is made, the defect of one column does not prevent two neighboring columns, but two distant columns, from being read correctly. In FIG. 3, two column conductors are connected together. It is of course possible to connect a number of other column conductors.

As in the case of a traditional detector as illustrated in FIG. 1a, the matrix 13 of pixels P(i,j) comprises columns Cj of even ranks and of odd ranks. A choice can be made to make the connection between two column conductors Yj either with conductors Yj of columns of even ranks or with conductors Yj of columns of odd ranks.

Figure 4:
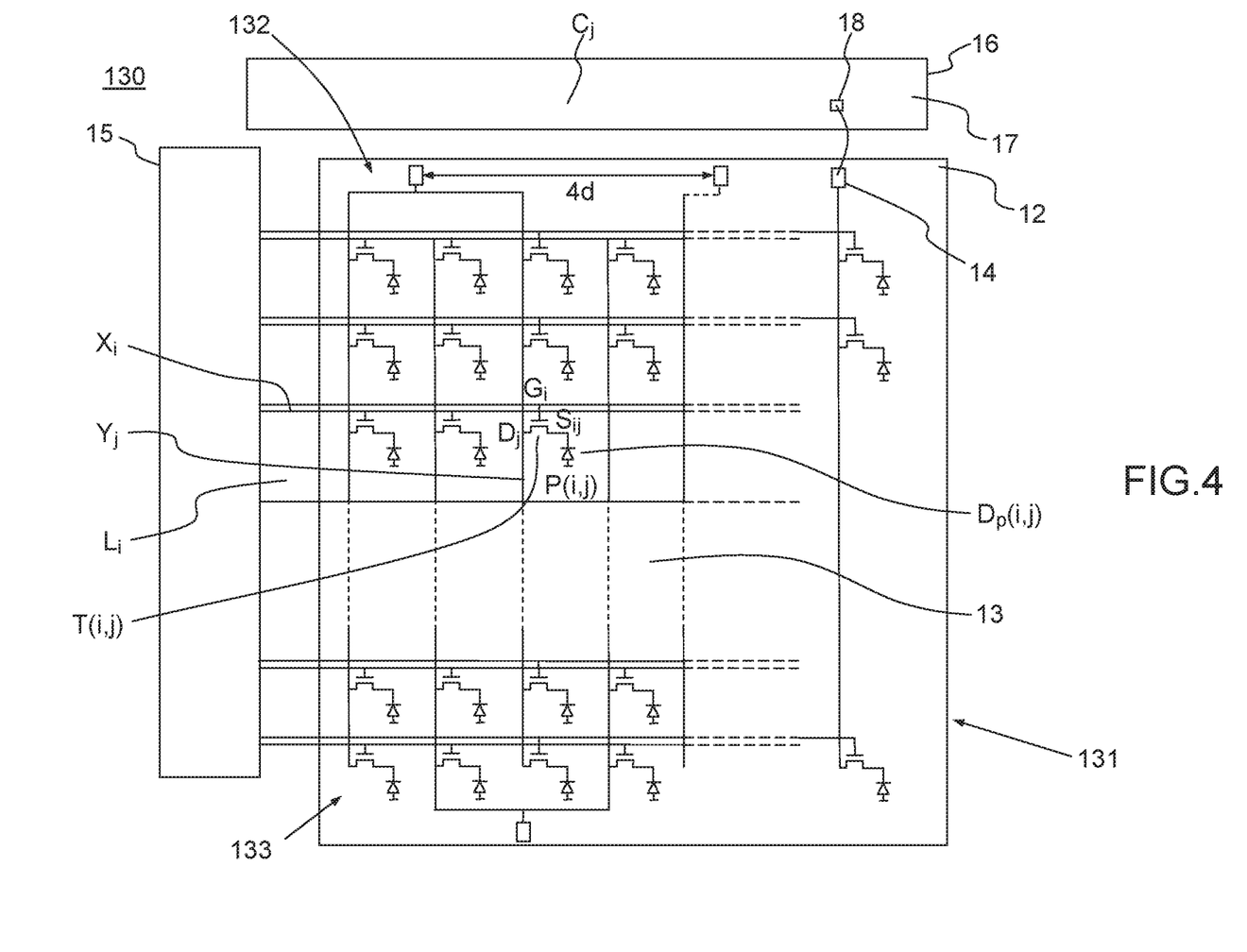
FIG. 4 represents a third image detector configuration according to the invention.

FIG. 4 represents another configuration of an image detector 130 with a sensor 131 according to the invention. All the elements are identical to the image detector 120 represented in FIG. 3, except for the positioning of the bump contacts 14 and for the connection of the column conductors Cj. In FIG. 4, the bump contacts 14 are situated on a first side 132 and on a second side 133 of the matrix 13. The connection between at least two column conductors Yj is made alternately on the first side 132 and on the second side 133 of the matrix 13. It is for example possible to connect, on the first side 132 of the matrix 13, conductors Yj of columns of even ranks together and, on the second side 133 of the matrix, conductors Yj of columns of odd ranks together. This configuration offers the advantage of increasing the spacing between two bump contacts on the same side. In effect, two bump contacts are spaced apart by the distance 4d. Furthermore, the configuration presented in FIG. 4 reduces the number of column conductor crossings compared to the configuration presented in FIG. 3, thus reducing the increase in the capacitive charge due to the crossing of the column conductors.

Figure 5:
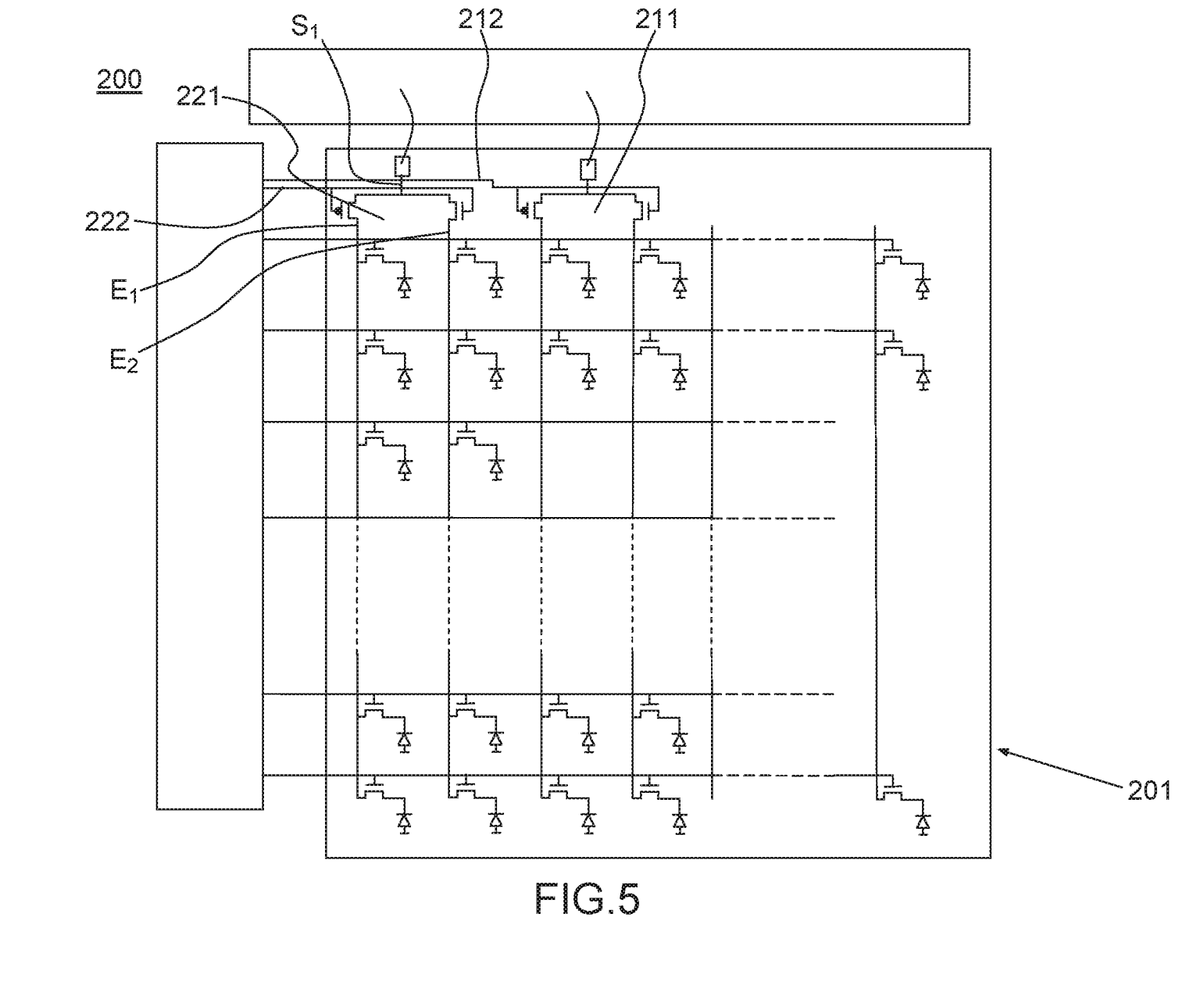
FIG. 5 represents a fourth image detector configuration according to the invention.

FIG. 5 represents another configuration of an image detector 200 according to the invention. The image detector 200 comprises a sensor 201. All the elements are identical to the image detector 100 represented in FIG. 2a except for the number of row conductors and the connection of the column conductors Yj to the bump contacts 14. The configuration represented in FIG. 5 comprises a multiplexer for two columns of pixels. The connection between two column conductors Yj is made by means of a multiplexer. In FIG. 5, two multiplexers 211, 221 are represented. A multiplexer is a circuit that makes it possible to concentrate, on one and the same transmission pathway, a plurality of links by selecting one input out of a certain number of inputs. The multiplexers 211 and 221 are so-called "two-to-one" multiplexers, or one-bit multiplexers. A one-bit multiplexer makes it possible to select one input out of two available inputs, giving the value of the input at the output. The multiplexer 221 comprises two possible inputs E1 and E2 and one output S1. A command line 222 indicates which input is chosen. If the input E1 is chosen, the output S1 will take the value of E1. Conversely, if the input E2 is chosen, the output S1 will take the value of E2. The use of a multiplexer to pool two columns Cj of pixels P(i,j) makes it possible to no longer have a double row conductor per row Li of pixels P(i,j) as in the configuration of FIGS. 2a and 2b. The image detector 200 comprises one command line per multiplexer. Thus, the capacitive charge represented by two column conductors connected two by two is not increased as is the case with the configuration represented in FIG. 2a. The pooling of two column conductors per multiplexer makes it possible to reduce the noise in the image detector compared to the configuration of FIG. 2.

FIG. 5 represents the pooling of two column conductors but, as for the preceding configurations, it is perfectly possible to connect several thereof together.

Figure 6:
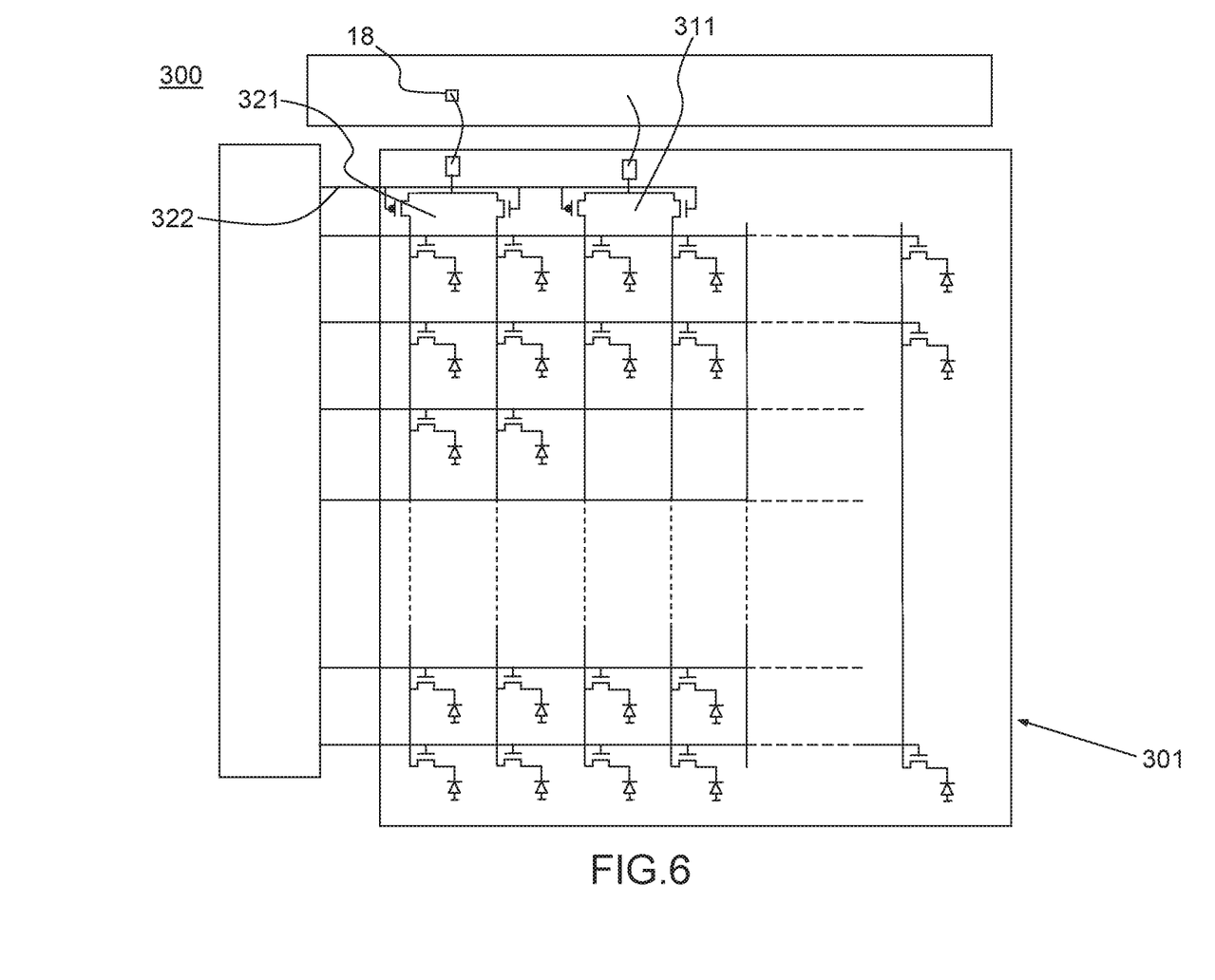
FIG. 6 represents a fifth image detector configuration according to the invention.

FIG. 6 represents a configuration of an image detector 300 according to the invention. The image detector 300 comprises a sensor 301. All the elements are identical to the image detector 200 represented in FIG. 5 except for the command lines of the multiplexers. In FIG. 6, the detector 300 comprises one single command line for a number of multiplexers. Two multiplexers 311 and 321 are represented. As for the configuration represented in FIG. 5, each multiplexer comprises two inputs, one output and one command line 322. The command line 322 indicates, for each multiplexer 311 and 321, which input is chosen to determine the value of the putout which will be processed by the column reading block 16. Thus, for each bump contact 18, either the signal delivered by a pixel of odd rank in its row is obtained, or the signal delivered by a pixel of even rank in its row is obtained, as a function of the command line 322.

Figure 7:
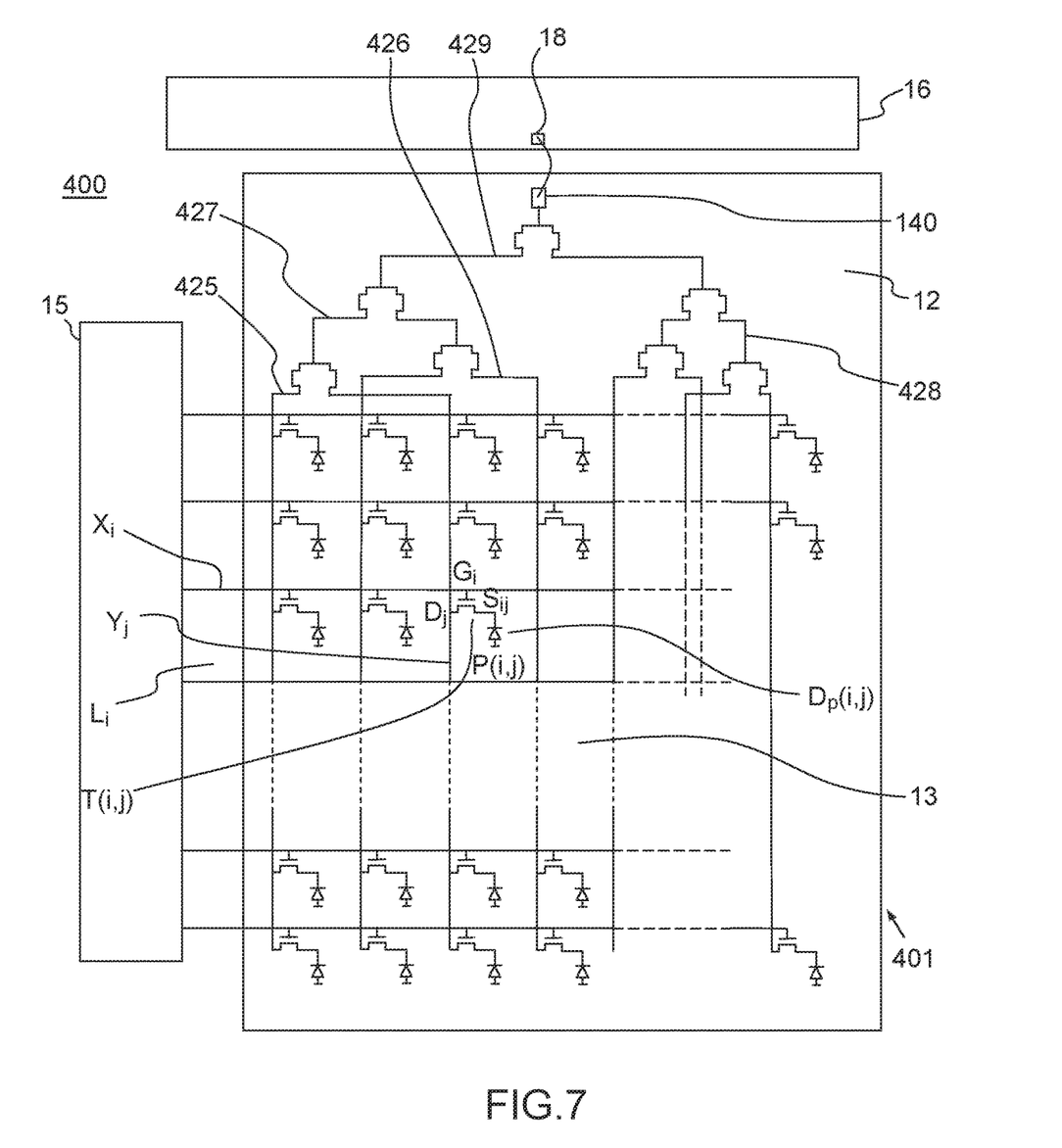
FIG. 7 represents a sixth image detector configuration according to the invention.

FIG. 7 represents another variant of an image detector 400 according to the invention. The image detector 400 comprises a sensor 401. All the elements are identical to the image detector 200 represented in FIG. 5 except for the connection of the multiplexers to the bump contacts. A group 425 of connected column conductors consists of at least two column conductors Yj connected together. Similarly, a group 426 of connected column conductors consists of at least two column conductors Yj connected together. At least two groups 425, 426 of connected column conductors Yj are connected together on the first substrate 12 outside of the matrix 13 of pixels P(i,j). The groups 425 and 426 of column conductors Yj connected together form a connection stage 427 and can converge toward a bump contact 14. Similarly, another connection stage 428 is defined. Similarly, two connection stages 427 and 428 can be connected together and form a higher level connection stage 429. Finally, it is possible for all the stages to be connected together and converge toward a single bump contact 140 on one side of the matrix 13. In other words, the column conductors Yj are connected together and converge toward a single bump contact 140 on one side of the matrix 13 through the different connection stages.

As represented in FIG. 7, the connection between the column conductors, between the groups of conductors and between the connection stages is made by multiplexers. In the interests of better legibility, the command lines of the multiplexers are not represented in FIG. 7. The characteristics and commands of the multiplexers are identical to those presented in FIG. 5. Similarly, it is possible to envisage having simple connections between column conductors, between groups of conductors and between connection stages, as represented in FIG. 3. Another configuration is a configuration with simple connections as represented in FIG. 4, with connections alternately on one side or on the other side of the matrix of pixels. Finally, another configuration would consist in having simple connections and connections by multiplexers. These last three configurations involving multiple simple connections are nevertheless difficult to implement since each connection requires an additional command line.

Figure 8:
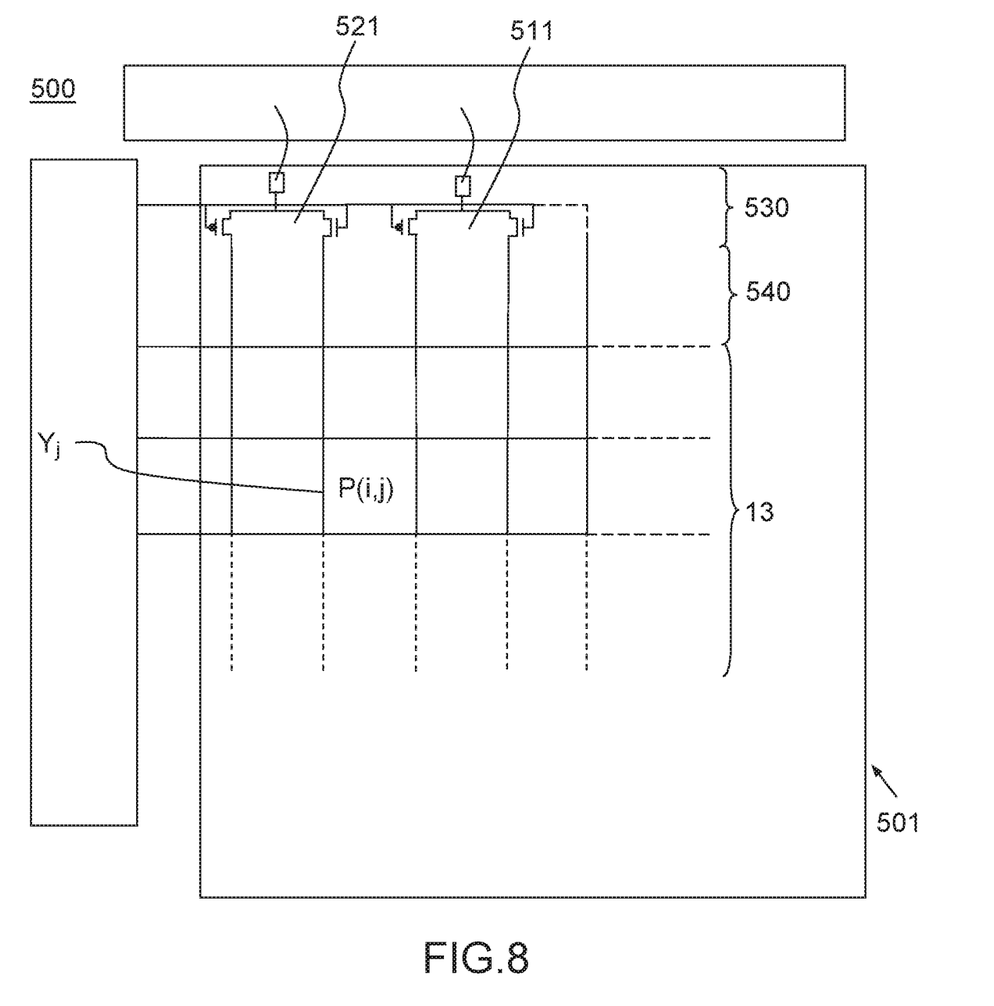
FIG. 8 represents the image detector according to the invention, with a sensor comprising three distinct zones.

FIG. 8 represents an image detector 500 according to the invention. The image detector 500 comprises a sensor 501 and connection means for two column conductors. In FIG. 8, two multiplexers 511 and 521 are represented. Obviously, it could also be a simple connection as represented in FIG. 2a. The sensor 501 comprises the matrix 13 of pixels, a zone 530 of connection of the column conductors Yj distinct from the matrix 13 and a zone 540 dedicated to the repairing of the column conductors Yj distinct from the matrix 13 and the zone 530 of connection of the column conductors Yj. The zone 540 dedicated to the repairing of the column conductors Yj is situated between the matrix 13 and the zone 530 of connection of the column conductors Yj. The repairing zone 540 notably makes it possible to make a repair by laser. In case of a pixel column defect, it may be desirable to isolate the defective column. This isolation can be done using a laser beam which is sent to the column conductor of the defective column in the repairing zone 540. The column conductor can be a metal track. Under the effect of the laser beam, the metal evaporates. The track is then cut and the defective column is isolated.

The invention claimed is:

1. An image detector comprising:
 a sensor produced on a first monolithic substrate comprising:
 a set of pixels organized in a matrix in rows and columns and configured so as to generate signals as a function of a radiation striking the detector;
 a plurality of column conductors, each linking pixels of a same column and intended to convey the signals generated by the pixels of the same column;
 at least one bump contact situated at a periphery of the first substrate and outside of the matrix of pixels and linked to the column conductors;
 at least a pair of first row conductor and second row conductor; and
 at least a first row addressing block and a second row addressing block, wherein the first row addressing block is situated on one side of the matrix and the second row addressing block is situated on another side of the matrix, wherein the first row conductor is connected to the first row addressing block and to first pixels of a first row while the second row conductor is connected to the second row addressing block and to second pixels of the first row,
 wherein at least two column conductors are connected together on the first monolithic substrate outside of the matrix of pixels and the at least two column conductors directly connected together converge toward the at least one bump contact,
 wherein the image detector further comprises a plurality of row conductors including the first and second row conductors, each of which links pixels of a same row and conveys a control signal to transfer signals of the pixels of the same row, and
 wherein the first row and the second row addressing blocks are configured to individually control each row and each column of pixels of the at least two connected column conductors though the at least two connected column conductors are connected together.

2. The image detector as claimed in claim 1, wherein two column conductors belong to a first group of connected conductors and two other column conductors belong to a second group of distinct connected conductors, and wherein the first group and the second group are interleaved.

3. The image detector as claimed in claim 1, wherein the sensor comprises a number of bump contacts, in that the bump contacts are situated on a first side and on a second side of the matrix and wherein the connection between at least two column conductors is made alternately on the first side and on the second side of the matrix.

4. The image detector as claimed in claim 1, wherein the row addressing blocks are incorporated in the first substrate.

5. The image detector as claimed in claim 1, wherein the matrix comprises rows of even ranks and of odd ranks, and wherein one or more of the row conductors of rows of even ranks are linked to the first row addressing block on one side of the matrix and one or more of the row conductors of rows of odd ranks are linked to the second row addressing block on another side of the matrix.

6. The image detector as claimed in claim 1, comprising a column reading block produced on a second substrate different from the first substrate and linked to the at least one bump contact, to read the signals generated by the set of pixels.

7. The image detector as claimed in claim 1, wherein a number of the row conductors is equal to a number of connected columns.

* * * * *